(12) United States Patent
Xie et al.

(10) Patent No.: US 11,424,403 B2
(45) Date of Patent: Aug. 23, 2022

(54) MAGNETORESISTIVE RANDOM-ACCESS MEMORY CELL HAVING A METAL LINE CONNECTION

(71) Applicant: International Business Machines Corporation, Armonk, NY (US)

(72) Inventors: Ruilong Xie, Niskayuna, NY (US); Bruce B. Doris, Slingerlands, NY (US); Michael Rizzolo, Delmar, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 16/797,474

(22) Filed: Feb. 21, 2020

(65) Prior Publication Data

US 2021/0265559 A1 Aug. 26, 2021

(51) Int. Cl.
*H01L 43/02* (2006.01)
*G11C 11/16* (2006.01)
*H01L 43/12* (2006.01)

(52) U.S. Cl.
CPC ........... *H01L 43/02* (2013.01); *G11C 11/161* (2013.01); *H01L 43/12* (2013.01)

(58) Field of Classification Search
CPC ........ H01L 43/02; H01L 43/12; G11C 11/161
USPC ....................................................... 257/421
See application file for complete search history.

(56) References Cited

U.S. PATENT DOCUMENTS

| | | |
|---|---|---|
| 6,783,999 B1 | 8/2004 | Lee |
| 7,001,783 B2 | 2/2006 | Costrini |
| 7,241,668 B2 | 7/2007 | Gaidis |
| 9,559,294 B2 | 1/2017 | Hsu |
| 9,704,919 B1 | 7/2017 | Lu |
| 10,109,674 B2 | 10/2018 | Lu |
| 2005/0280040 A1* | 12/2005 | Kasko ................... H01L 27/228 257/213 |
| 2016/0181318 A1* | 6/2016 | Dong ...................... H01L 43/10 711/118 |
| 2016/0358976 A1* | 12/2016 | Eun ....................... H01L 27/2409 |
| 2016/0365505 A1* | 12/2016 | Lu .......................... H01L 43/08 |
| 2017/0047374 A1 | 2/2017 | Lu |
| 2020/0020688 A1* | 1/2020 | Badaroglu .......... H01L 21/0273 |
| 2020/0342926 A1* | 10/2020 | Katine ................. G11C 13/003 |
| 2021/0265559 A1* | 8/2021 | Xie ......................... H01L 43/02 |

FOREIGN PATENT DOCUMENTS

| | | |
|---|---|---|
| FR | 2930371 B1 | 10/2010 |
| JP | 2017092181 A | 5/2017 |
| WO | 2017171795 A1 | 10/2017 |
| WO | 2018182665 A1 | 10/2018 |

* cited by examiner

*Primary Examiner* — Jami Valentine Miller
(74) *Attorney, Agent, or Firm* — David K. Mattheis; Maeve Carpenter

(57) ABSTRACT

A method of fabricating an MRAM device, the method including forming a magnetoresistive random-access memory (MRAM) stack comprising a first hard mask, forming sidewall spacers adjacent to the MRAM stack, forming a layer of interconnect metal around and above the MRAM stack, recessing the interconnect metal, forming a layer of a second hard mask over the interconnect metal, and patterning and etching the second hard mask and interconnect metal, forming interconnect metal lines.

5 Claims, 20 Drawing Sheets

MAGNETORESISTIVE RANDOM-ACCESS MEMORY CELL HAVING A METAL LINE CONNECTION

BACKGROUND

The disclosure relates generally to semiconductor devices including magnetoresistive random-access memory (MRAM) and device interconnects. The disclosure relates particularly to devices including MRAM structures and metal line interconnects.

Vertical magnetoresistive random-access memory (MRAM) structures provide a path for the downscaling of semiconductor memory devices. Performance requirements dictate that MRAM elements be located as close to their associated transistors as possible, requiring associated device element interconnect elements to also be reduced in scale. As the scale of device elements diminishes, the ability to use damascene processes, with low resistance interconnects in lined cavities, also diminishes due to difficulty in forming the required copper-filled lined cavities.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a method of fabricating an MRAM device, the method including forming a magnetoresistive random-access memory (MRAM) stack including a first hard mask, forming sidewall spacers adjacent to the MRAM stack, forming a layer of interconnect metal around and above the MRAM stack, recessing the interconnect metal, forming a layer of a third hard mask over the interconnect metal, and patterning and etching the third hard mask and interconnect metal, forming interconnect metal lines.

In one aspect, A method of fabricating an MRAM device, the method including forming a magnetoresistive random-access memory (MRAM) stack including a first hard mask, forming sidewall spacers adjacent to the MRAM stack, forming a layer of interconnect metal around and above the MRAM stack, recessing the interconnect metal, forming a layer of a third hard mask over the interconnect metal, patterning and etching the third hard mask and interconnect metal, forming interconnect metal lines, filling spaces between the MRAM sidewall spacers and interconnect metal lines with interlayer dielectric material, selectively removing portions of the third hard mask material forming fully aligned vias for the metal interconnect lines, and filling the interconnect vias with a conductive material.

In one aspect, an MRAM semiconductor device includes an MRAM cell capped with a first hard mask with a first height, and at least one metal line capped with a third hard mask, with a second height. The first height and the second height are about the same.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference number generally refers to the same components in the embodiments of the present disclosure.

DETAILED DESCRIPTION

Figure 1:
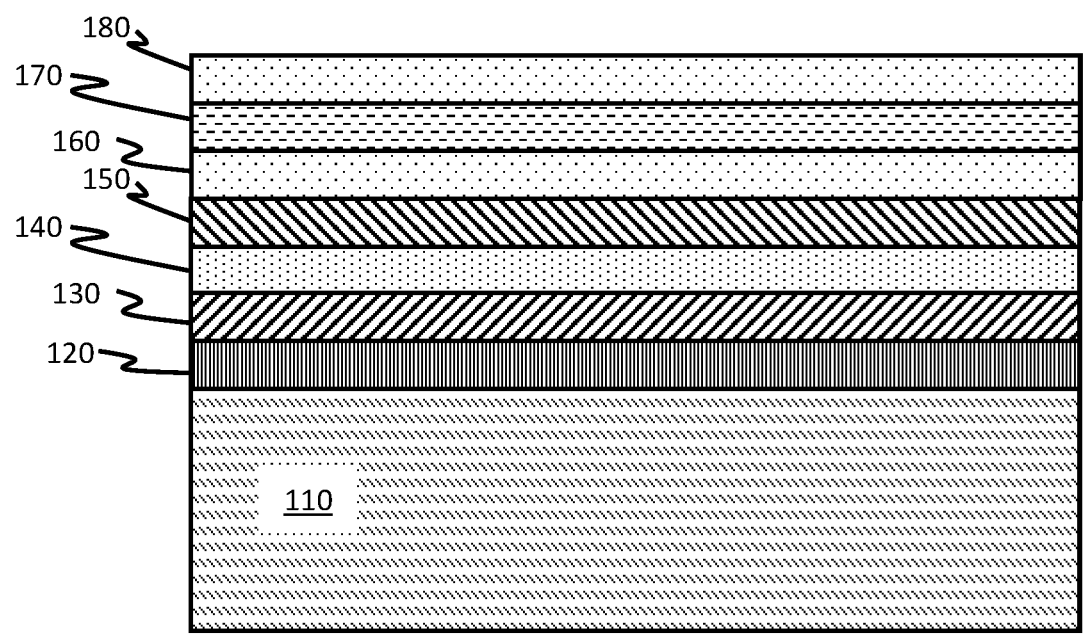
FIG. 1 provides a cross-sectional view of a step in the fabrication of a semiconductor device, according to an embodiment of the invention. The figure illustrates a formed stack of layers prior to the patterning of MRM stack elements including: reference layer, tunnel barrier layer, free layer, upper electrode layer, first hard mask layer, $SiO_2$ layer, and second hard mask layer.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

As semiconductor device element back-end-of-line pitch scale diminishes, the use of metal damascene processes—including the use of lined low resistance copper-based interconnects between metal layers of the device—becomes problematic. Problems arise from difficulties controlling the formation of the interconnects together with FAV (fully aligned vias) for the interconnects. Fully aligned vias are metal connections between device metal lines which are completely aligned with the associated metal line. As an example, a FAV between a first metal line and a third metal line may be fully aligned with the first metal line, the third metal line or both. Though subtractive metal patterning provides a possible alternative (and does not require the additional steps or space needed for the damascene liner), the use of such processes together with conventional MRAM formation processes yields very tall metal interconnect elements. Further, the desired metal interconnects are not co-planar with the MRAM cell structures, requiring structural accommodations to adapt the MRAM cell structures to subsequent device element formation. Disclosed embodiments provide devices and fabrication methods to produce MRAM elements in association with metal interconnects at element pitch scaling less than 7 nanometers (nm).

In an embodiment, an intermediate device includes MRAM cell structures capped with first hard mask layer including upper and lower hard mask layers separated by a layer of $SiO_2$. During fabrication, much or all of the upper hard mask layer is etched away prior to deposition of a third hard mask layer. The first hard mask lower protective layer extends to a first height in the device. The device also includes metal interconnect lines capped by the third hard mask protective layer deposited after removal of the upper hard mask and SiO$_2$ layers. The third hard mask protective layer extends to a second height in the device. The first and second heights are co-planar. The device includes protective sidewalls disposed adjacent to the MRAM cell structures. In an embodiment, no protective sidewalls are disposed adjacent to the metal interconnect lines. In this embodiment, the metal interconnect lines have a negative taper in that the lines have a cross-section with a base that tapers toward the top of the cross-section.

Reference is made to elements of FIGS. 1-18 in the following description. Fabrication of the device includes the formation of the MRAM cell structures from an appropriate stack of material layers including first and second protective hard mask layers (items 160 and 180 of FIG. 1). Protective sidewalls (310, FIG. 3) are disposed upon the vertical surfaces of the formed MRAM cell structures (210, FIG. 2). The protective sidewalls 310 extend to the height of the upper hard mask 180 of the MRAM cell structures. A metal layer (410, FIG. 4) is disposed around and above the formed MRAM cell structures 210. The metal layer 410 is recessed to the height of the desired metal interconnect lines. A third hard mask layer (610, FIG. 6) is disposed above the recessed metal layer 410. Chemical-mechanical planarization (CMP) yields smooth and co-planar upper surfaces for the first hard mask 160, the protective sidewalls 310 and the third hard mask 610. The third hard mask 610 and metal layers 410 are patterned and etched away to yield a plurality of metal interconnect lines (710, FIG. 7) each capped with the protective third hard mask 610. The third hard mask layers 610 extend to the same height as the protective sidewalls 310 and first hard mask 160 of the MRAM cell structures 210. Deposition of inter-layer dielectric (ILD) material (810, FIG. 8) in the patterned spaces between MRAM sidewall spacers 310 and metal interconnect lines 710 completes the intermediate device fabrication.

Figure 9:
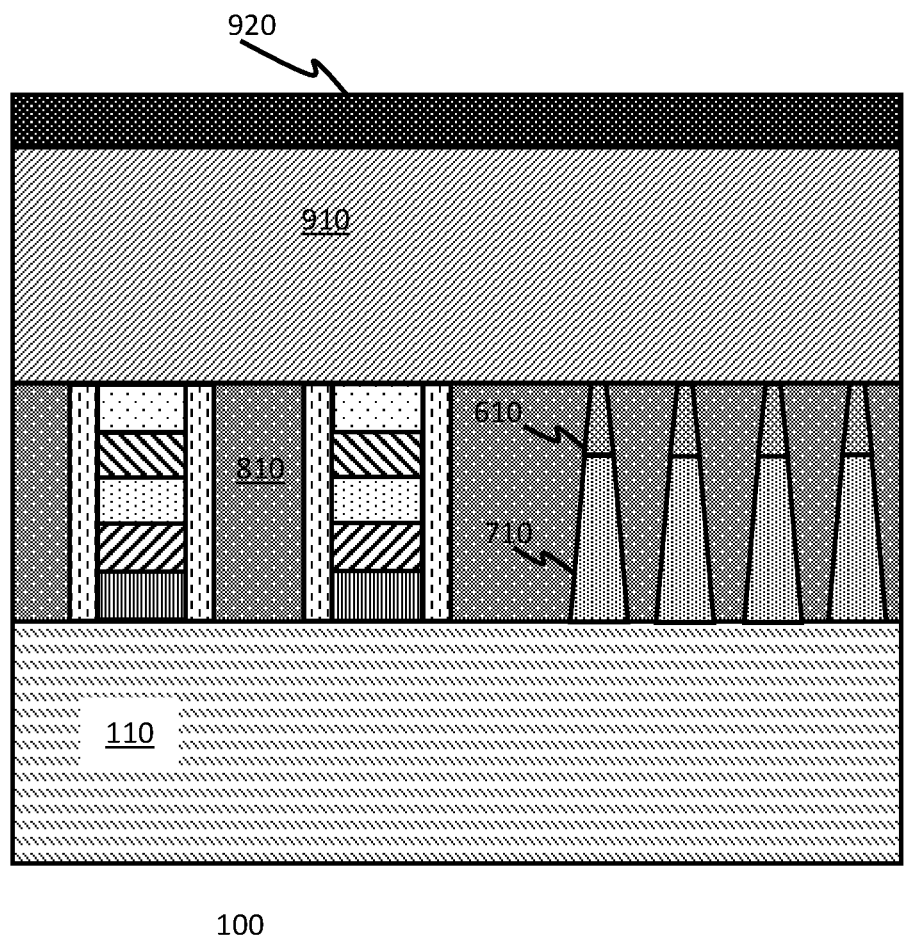
FIG. 9 provides a cross-sectional view of a step in the fabrication of a semiconductor device, according to an embodiment of the invention. The figure illustrates the device after the deposition of a low-k protective layer.

In an embodiment, device fabrication proceeds with the deposition of a low-k dielectric fill layer (910, FIG. 9) and an associated protective hard mask (920, FIG. 9). The low-k layer dielectric layer 910 and hard mask 920 are patterned and etched creating vias exposing the MRAM cell structure 210 upper hard mask 160 as well as the hard mask 610 of selected metal interconnect lines 710. Removal of the exposed MRAM and metal interconnect hard masks 160, 610, to form contact vias, together with subsequent metallization of the vias, yields an intermediate device having MRAM cell structures 210 and metal interconnects 710 with metal contacts at a common upper planar surface. The metal interconnect lines have fully aligned vias to the height of the MRAM cell structure.

Figure 13:
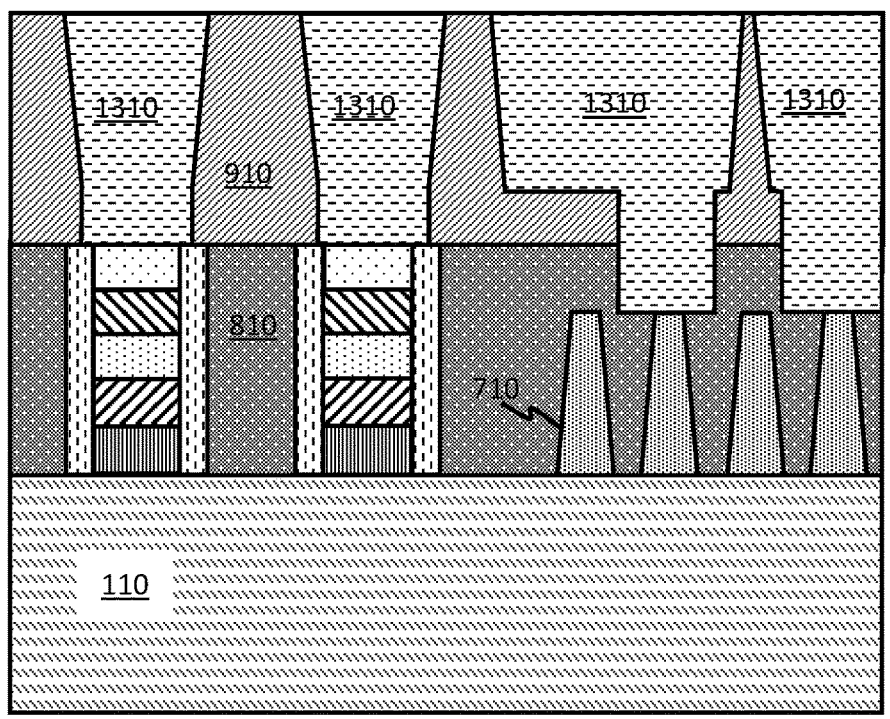
FIG. 13 provides a cross-sectional view of a step in the fabrication of a semiconductor device, according to an embodiment of the invention. The figure illustrates an alternative device embodiment without fully aligned vias for the interconnect lines.

In an embodiment, FIG. 13, after formation of the patterned metal interconnect lines 710, removal of the third hard mask layer 610 above the metal interconnect lines 710 occurs. In this embodiment, the spaces between MRAM cell structures 210 and metal interconnect lines 710 are filled with ILD 810 and CMP yields a co-planar surface for the MRAM cell structures 210 and the ILD 810 above the metal interconnect lines 710. Fabrication continues with the deposition of a low-k fill layer 910 and accompanying hard mask 920. Staged etching of these layers creates vias and exposes the upper hard mask 160 of the MRAM cell structures 210 and the upper surface of the ILD 810. Further etching extends the vias 1010 and exposes the upper surfaces of the MRAM upper electrode 150 and selected metal interconnect lines 710. Metallization of the vias completes the intermediate fabrication yielding MRAM cell structures 210 and associate metal interconnect lines 710 together with coplanar metal contacts 1310 for those device elements. The intermediate device structure lacks FAV for the metal interconnect lines 710.

In an embodiment, FIGS. 14-18, after completing the intermediate fabrication to a point of co-planar MRAM cell structure 210, metal interconnect line hard masks 610 and ILD layers 810, selected metal interconnect line 710 hard mask portions 610 are etched away yielding fully aligned vias for the selected metal interconnect lines 710. The MRAM hard mask layer 160 may also be selectively etched away yielding a via to the upper MRAM electrode 150. Metallization of the created vias yields selected metal interconnect lines 710 with FAV (1510, FIG. 15) to the upper surface of the ILD layer 810. In an embodiment where the MRAM hard mask 160 has been etched away, further metallization yields a metal contact for the MRAM top electrode 150 to the upper surface of the ILD layer 810.

In this embodiment, further etching removes the third hard mask 610 from any remaining metal interconnect lines 710, yielding vias to the upper surface of the ILD layer 810. Deposition of a low-k dielectric fill layer (1710, FIG. 17) and accompanying protective hard mask layer occur. Etching of the protective hard mask and low-k layers yields vias exposing the metal interconnect FAV 1510 and the upper surface of the MRAM metal contact 150 or hard mask layer 160. Metallization of the vias yield an intermediate device having MRAM cell structures 210 and accompanying metal interconnect lines 710 together with their associated metal contacts (1810, FIG. 18) at a common planar surface. In this embodiment, the metal interconnect lines 710 have FAV 1510, unused metal interconnect lines are capped with ILD material rather than hard mask material, reducing the capacitance of the combination of unused lines and the metallized vias.

FIG. 1 provides a cross-sectional view of the intermediate device 100 after the deposition of a series of material layers upon an underlying device 110, prior to the formation of individual MRAM cell structures. As shown in FIG. 1, a succession of layers is deposited upon underlying device 110 to form the vertical magnetic-tunnel junction (MTJ) stacks of the MRAM cells. In an embodiment, the MTJ stacks includes a simplistically depicted MTJ made of a reference magnetic layer (a layer having a fixed magnetic dipole moment) 120 a tunnel barrier layer 130, a free magnetic layer 140 (a layer having a switchable magnetic dipole moment), and an upper electrode 150. The reference layer 120 may include, for example one or more interfacial layers, or spacers, and ruthenium, cobalt, palladium, tantalum, iron, boron, cobalt-platinum (Co|Pt) or cobalt-palladium (Co|Pd), in multilayers or a mixture. In an embodiment, reference layer 120 is between about 3 nm and about 10 nm in thickness. Next, a tunnel barrier 130 is formed on reference layer 120. The tunnel barrier 130 may include a non-magnetic insulating material such as magnesium oxide (MgO). In an embodiment, tunnel barrier 130 is between about 1 nm and about 3 nm in thickness. Following the formation of the tunnel barrier 130, the free layer 140 is formed on top of the tunnel barrier 130. In this embodiment, the MTJ includes a seed layer (not shown) having free layer 140 grown thereon. The seed layer may include, for example, tantalum (Ta) or tantalum magnesium (TaMg) in some embodiments. The free layer 140 may include cobalt-iron-boron (CoFeB), for example. The respective layers may be formed by PVD. The free layer 140 and the reference layer 120 have perpendicular magnetic anisotropy. Upper electrode layer 150 may include Nb, NbN, W, WN, Ta, TaN, Ti, TiN, Ru, Mo, Cr, V, Pd, Pt, Rh, Sc, Al, and other high melting point metals or conductive metal nitrides, deposited by CVD, PVD or similar methods. In an embodiment, upper electrode 150 is between about 1 nm and about 10 nm in thickness.

In an embodiment, deposition of first hard mask layer 160, $SiO_2$ layer 170, and second hard mask layer 180 follows the deposition of upper electrode 150. In an embodiment, exemplary materials for first hard mask layer 160 and second hard mask layer 180 include Nb, NbN, W, WN, Ta, TaN, Ti, TiN, Ru, Mo, Cr, V, Pd, Pt, Rh, Sc, Al, and other high melting point metals or conductive metal nitrides, deposited by CVD, PVD or similar methods.

Figure 2:
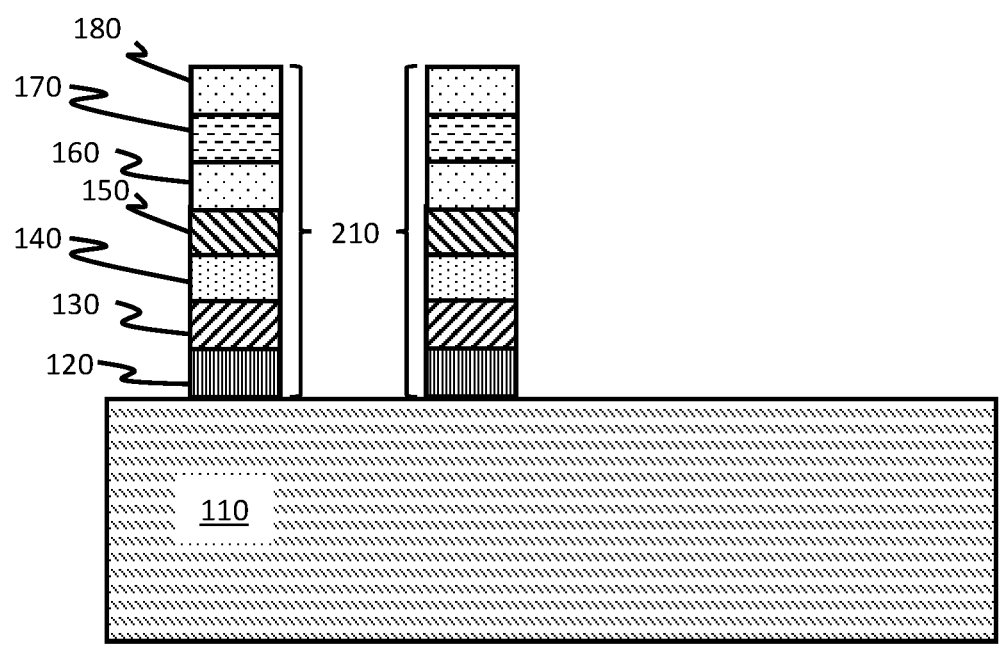
FIG. 2 provides a cross-sectional view of a step in the fabrication of a semiconductor device, according to an embodiment of the invention. The figure illustrates MRAM stack elements formed from the layers.

FIG. 2 provides a cross-sectional view of the device 100 at an intermediate stage of fabrication. As shown in the figure, layers 120-180 have been patterned and etched to yield MRAM cell structures 210. Exemplary etching processes include ion beam, etching (IBE) and reactive ion etching (RIE). The upper surface of second hard mask layer 180 extends to a first height above the surface of underlying device 110.

Figure 3:
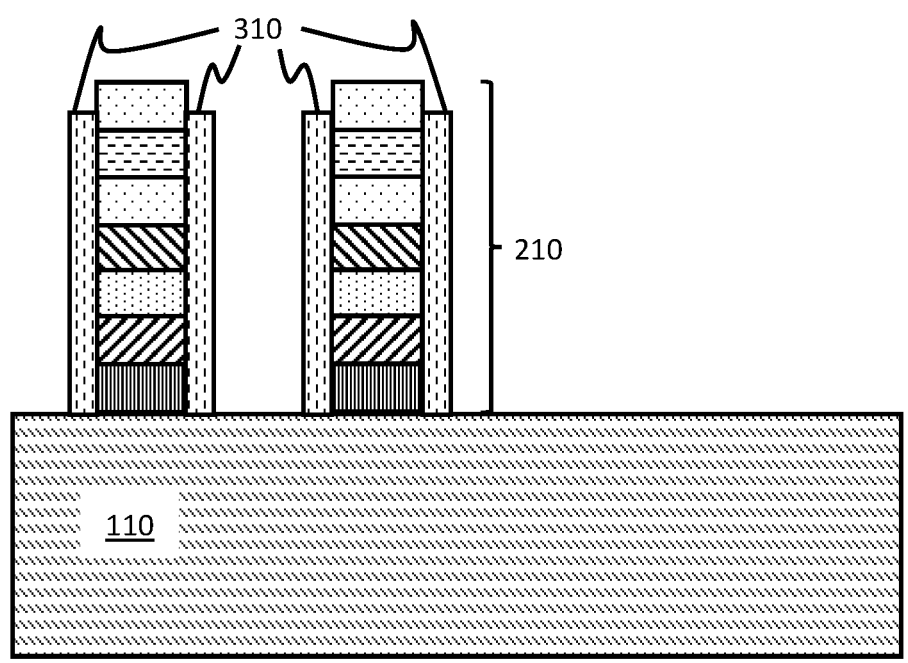
FIG. 3 provides a cross-sectional view of a step in the fabrication of a semiconductor device, according to an embodiment of the invention. The figure illustrates the device after the formation of protective sidewalls for the MRAM stack elements.

FIG. 3 provides a cross-sectional view of the device 100 at an intermediate stage of fabrication. The figure illustrates the device 100 after the addition of protective sidewalls 310 to the vertical surfaces of the MRAM cell structures 210. Exemplary protective sidewall 310 materials include SiCO, SiC, $SiO_2$, and similar materials. In an embodiment, sidewall-image-transfer (SIT) methods, or material deposition followed by RIE, are used to form the sidewalls 310.

Figure 4:
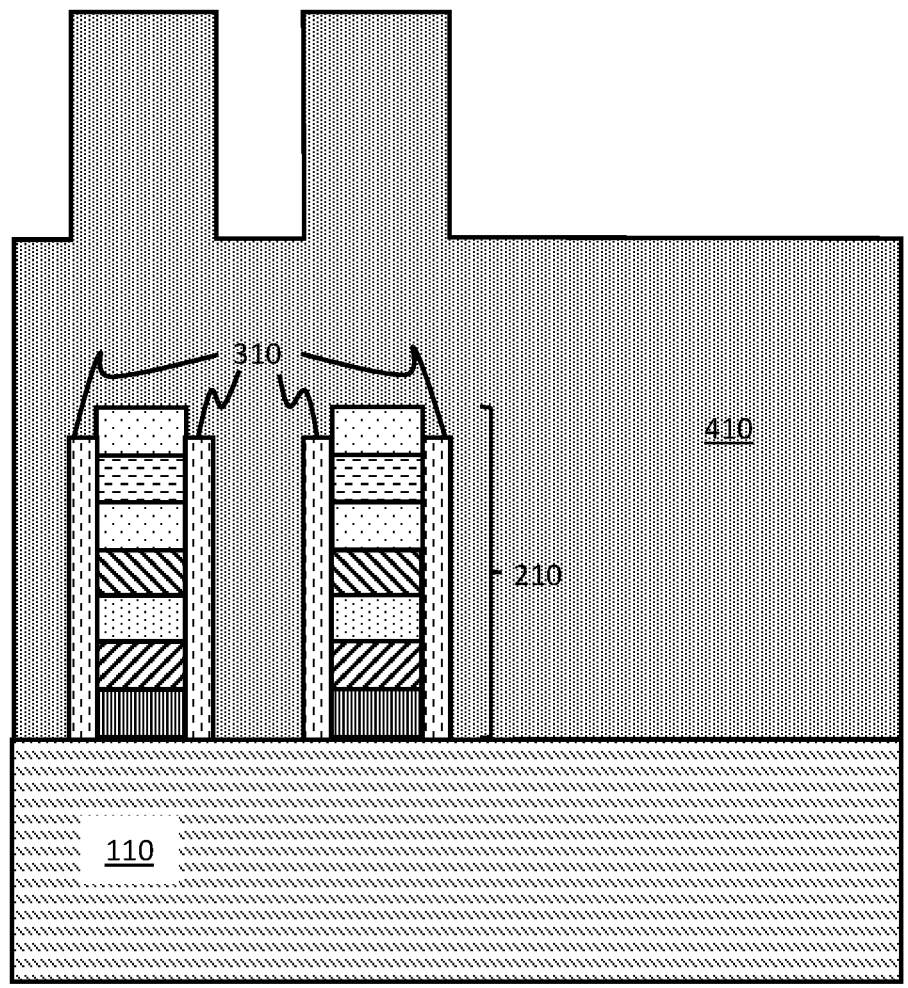
FIG. 4 provides a cross-sectional view, of a step in the fabrication of a semiconductor device, according to an embodiment of the invention. The figure illustrates the device after the deposition of the interconnect metal layer.

FIG. 4 illustrates the device 100 after deposition of conductive metal layer 410 around and above MRAM cell structures 210 and sidewalls 310. Exemplary metal layer materials include Ru and similar metals. Metal layer 410 deposition methods include CVD, ALD and PVD. In an embodiment, deposition occurs using PVD due to the required thickness of the layer. In an embodiment, metal layer 410 ranges in thickness from about 50 nm to about 300 nm.

Figure 5:
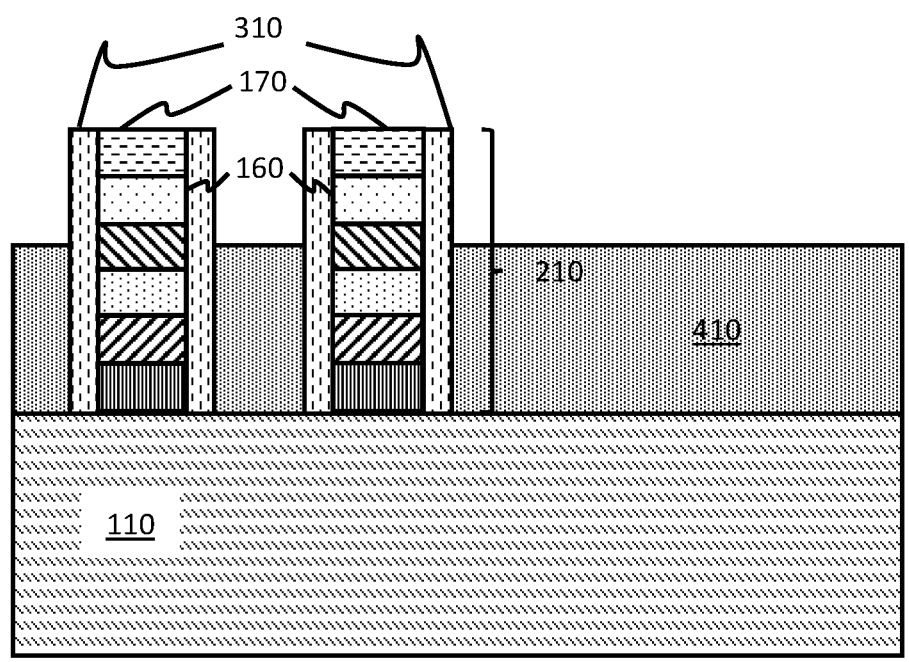
FIG. 5 provides a cross-sectional view of a step in the fabrication of a semiconductor device, according to an embodiment of the invention. The figure illustrates the device after the trimming back of the interconnect metal layer.

FIG. 5 illustrates the intermediate device 100 after trimming metal layer 410 back to the desired height of the metal interconnect lines of the device design. In an embodiment, CMP processes trim metal layer 410 back to the height of the MRAM cell structure and RIE then trims the metal layer 410 down to the desired height relative to the underlying device 110. In an embodiment, CMP trimming of metal layer 410 also etches away a portion or all of second hard mask layer 180 and parts of sidewalls 310, to the height of the $SiO_2$ layer 170. In this embodiment, $SiO_2$ layer 170 provides protection for first hard mask layer 160 as etching of metal layer 410 proceeds.

Figure 6:
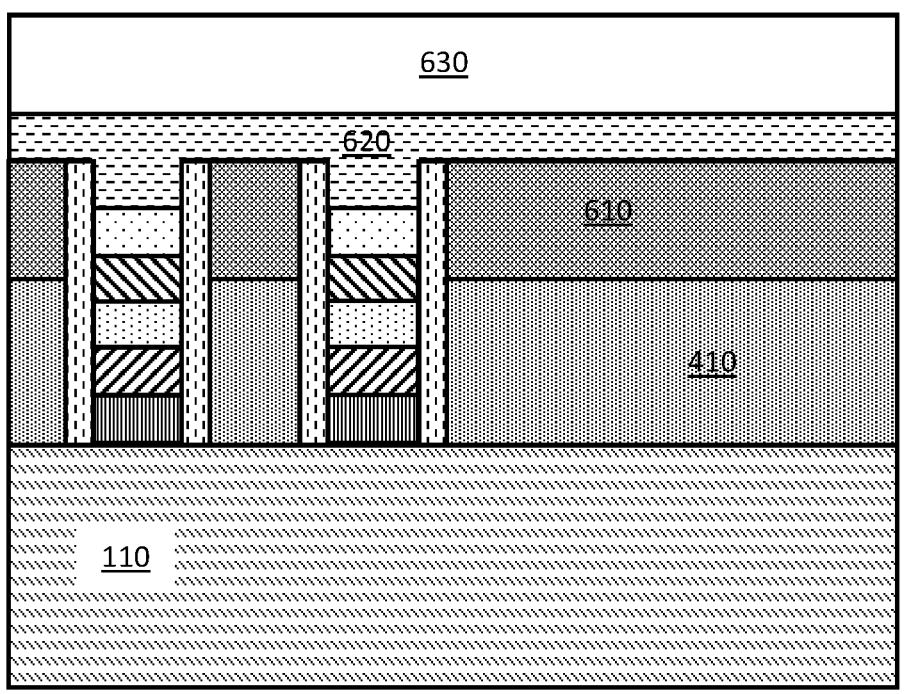
FIG. 6 provides a cross-sectional view of a step in the fabrication of a semiconductor device, according to an embodiment of the invention. The figure illustrates the device after the trimming back of the MRAM stack, including the removal of the second hard mask layer and portions of the MRAM sidewalls, and deposition of third hard mask, $SiO_2$, and organic planarization layer (OPL) layers.

FIG. 6 illustrates intermediate device 100 after the deposition of a third hard mask material 610 over trimmed metal layer 410. As shown in the figure, CMP of third hard mask material 610, such as SiN, deposited over metal layer 410, yields a structure where the upper surfaces of the MRAM $SiO_2$ layer, the sidewalls 310, and the third hard mask material 610, are co-planar. As shown in the figure, a thin layer of $SiO_2$ 620, having a thickness of between about 10 nm and about 50 nm. is subsequently deposited upon the co-planar surfaces. Deposition of an organic planarization layer (OPL) 630, for subsequent patterning, occurs after the $SiO_2$ 620 deposition.

Figure 7:
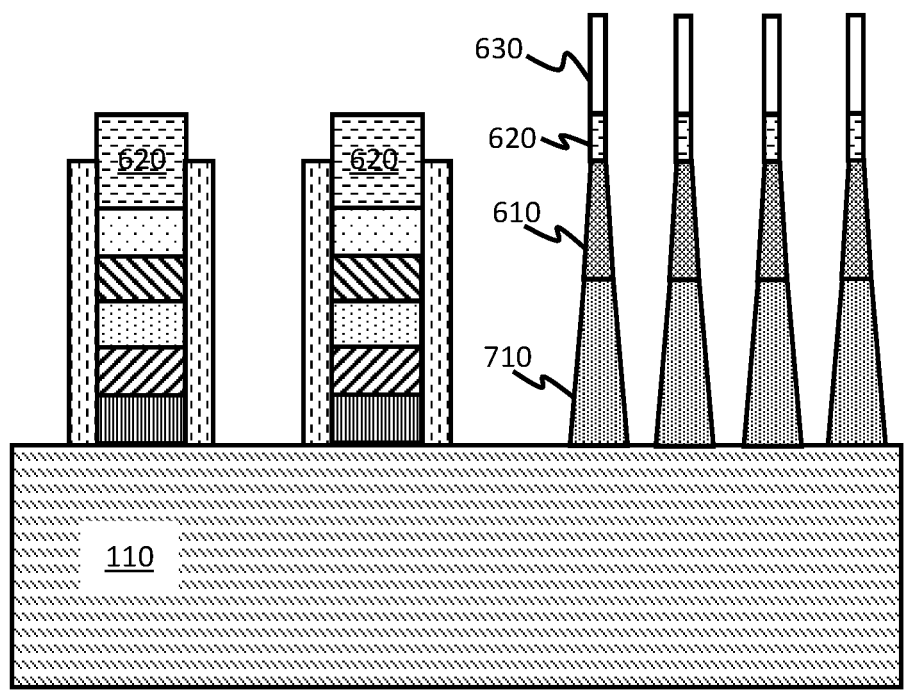
FIG. 7 provides a cross-sectional view of a step in the fabrication of a semiconductor device, according to an embodiment of the invention. The figure illustrates the device after the patterning and etching of the third hard mask, $SiO_2$, and interconnect metal layers.

FIG. 7 illustrates intermediate device 100 after the formation of metal interconnect lines 710. As shown in the figure, OPL 630, $SiO_2$ 620, third hard mask 610, and metal layer 410, are selectively etched away leaving metal interconnect wires 710 capped by third hard mask material 610, $SiO_2$ 620 and OPL 630. Metal subtractive patterning selective to the third hard mask material and the metal of metal layer 410, creates metal interconnect lines 710.

Figure 8:
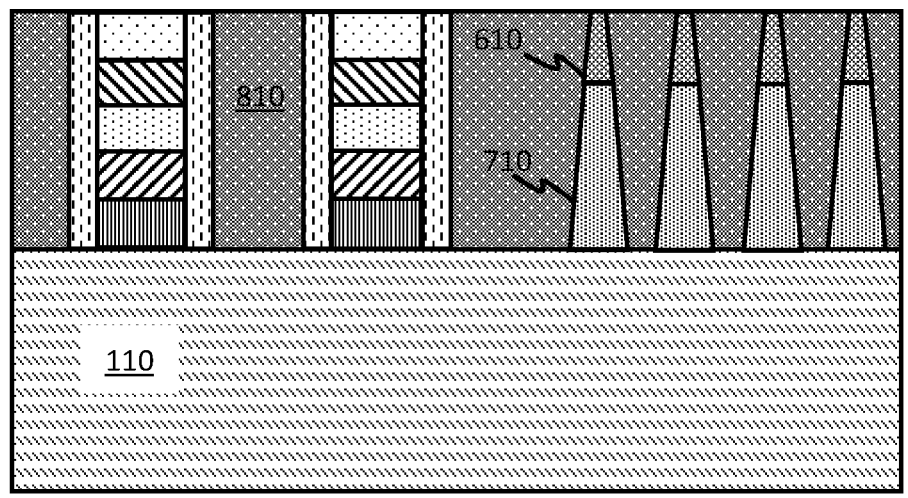
FIG. 8 provides a cross-sectional view of a step in the fabrication of a semiconductor device, according to an embodiment of the invention. The figure illustrates the device after the removal of the $SiO_2$ layer—including the MRAM stack $SiO_2$ layer, and the deposition of an ILD material.

FIG. 8 illustrates intermediate device 100 after the deposition and planarization of ILD material 810. As shown in the figure, OPL 630, and $SiO_2$ 620 are removed together with portions of MRAM structure sidewalls 310 and hard mask material 610. Deposition of ILD material 810, such as a flowable CVD C-doped oxide low-k dielectric, fills the intervening spaces between adjacent MRAM cell structure sidewalls 310, spaces between MRAM cell structure sidewalls 310 and metal interconnect lines 710, and spaces between adjacent metal interconnect lines 710. CMP after ILD 810 deposition provides a smooth surface for subsequent process steps.

FIGS. 9-12 illustrate fabrication steps associated with advancing the overall device fabrication after formation of the underlying structure including MRAM cells and associated interconnect wires according to an embodiment of the invention.

FIG. 9 illustrates intermediate device 100 after deposition of a low-k dielectric fill layer 910. Deposition of a low-k dielectric fill layer 910, together with a sacrificial hard mask layer 920, prepares the intermediate device for the subsequent formation of device element vias and metal contacts. CVD ultra low-k dielectric, having a thickness of between about 40 nm and about 100 nm, may be used for fill layer 910. In an embodiment, sacrificial hard mask layer 920 includes SiN, $SiO_2$, TiN, or a combination of layers formed of these or similar materials, with a total thickness of between about 20 nm and about 50 nm.

Figure 10:
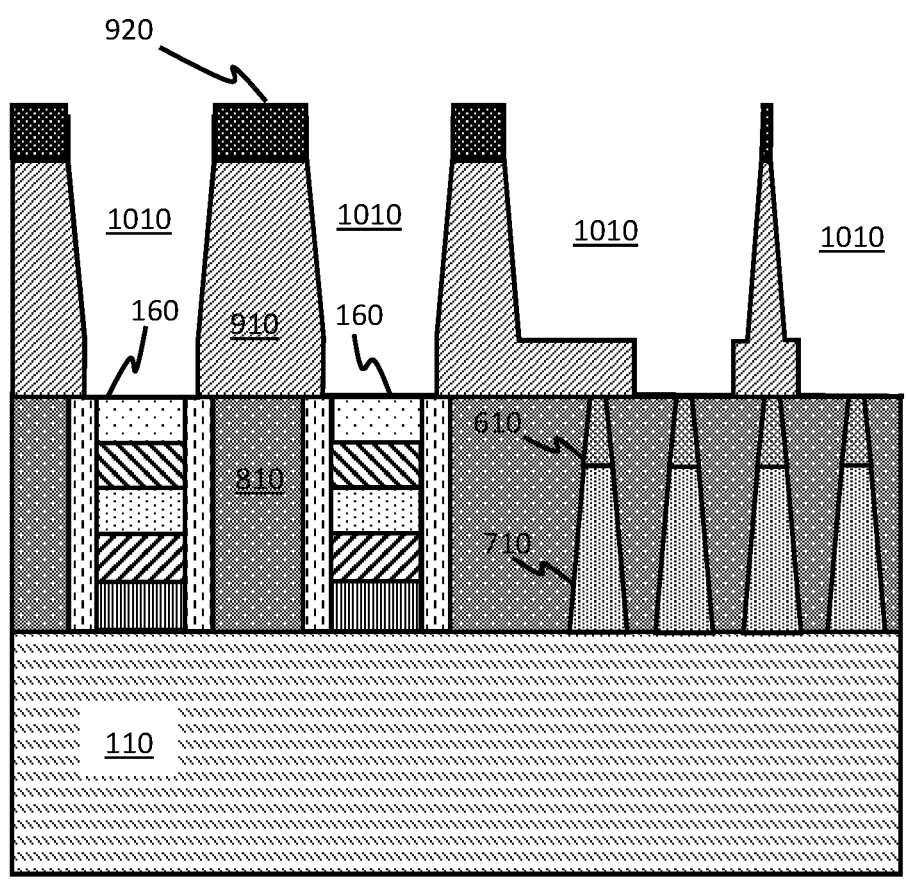
FIG. 10 provides a cross-sectional view of a step in the fabrication of a semiconductor device, according to an embodiment of the invention. The figure illustrates the device after patterning and etching of the low-k layer in preparation for forming fully aligned vias for the interconnects.

FIG. 10 provides an illustration of intermediate device 100 after the selective etching of device element vias 1010 through sacrificial hard mask 920 and into low-k fill layer 910. As shown in the figure, etching, such as RIE, of sacrificial hard mask 920 and low-k fill layer 910 creates vias 1010 and exposes MRAM cell structure 210 upper hard mask layer 160 as well as metal interconnect 710 upper hard mask layer 610.

Figure 11:
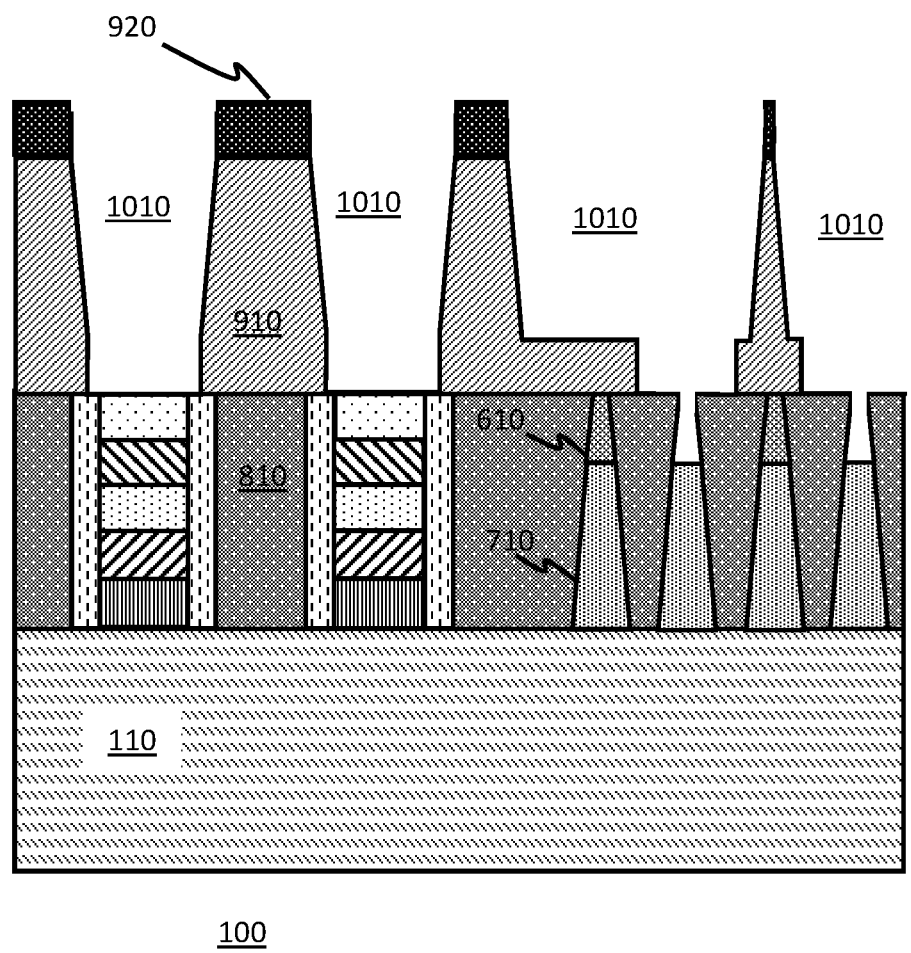
FIG. 11 provides a cross-sectional view of a step in the fabrication of a semiconductor device, according to an embodiment of the invention. The figure illustrates the device after the selective removal of portions of the third hard mask, exposing the interconnect metal.

FIG. 11 illustrates intermediate device 100 after the selective removal of hard mask 610 above selected metal interconnect lines 710 forming fully aligned vias (FAV) for the metal interconnect lines 710. As shown in the figure, selective etching removes exposed hard mask 610 from above selected metal interconnect lines 710.

Figure 12:
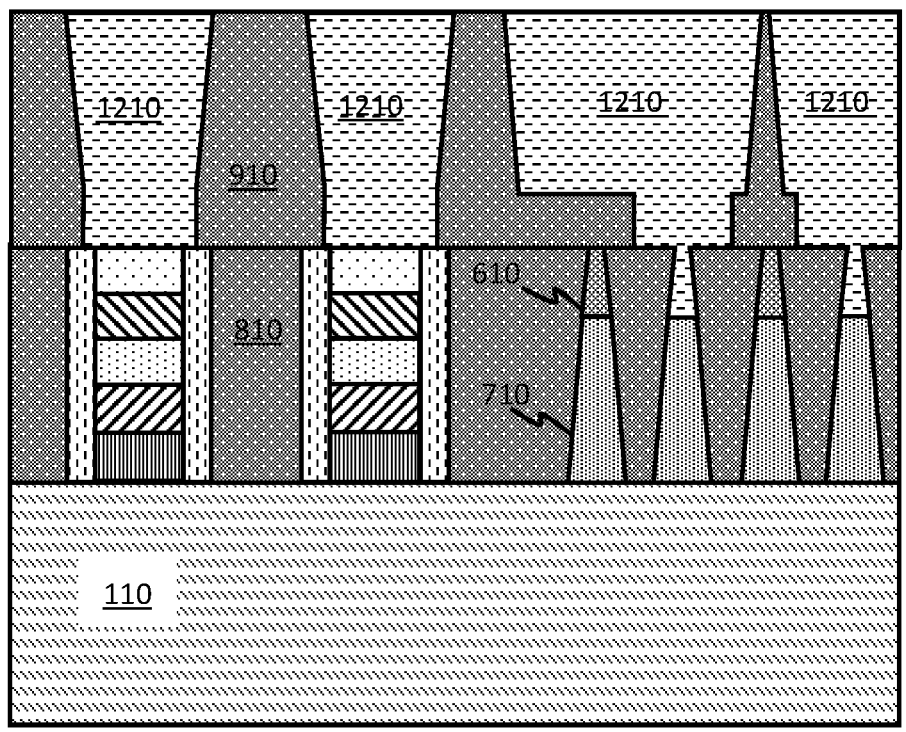
FIG. 12 provides a cross-sectional view of a step in the fabrication of a semiconductor device, according to an embodiment of the invention. The figure illustrates the device after the deposition and planarization of the metal contacts in the vias.

FIG. 12 illustrates intermediate device 100 after the completion of metal contacts 1210 for MRAM cell structures 210 and metal interconnect lines 710. As shown in the figure, metal growth in vias 1010 provides co-planar metal contacts 1210 for MRAM cell structures 210 and metal interconnect lines 710 to the upper surface of low-k fill layer 910.

FIG. 13 illustrates an alternative embodiment of the intermediate device 100 of the invention. As shown in the figure, removal of all third hard mask material 610 occurs after metal interconnect line 710 formation and before deposition of ILD material 810. Formation of metal contacts 1310 through low-k layer 910 connects MRAM cell structures 210 and metal interconnect lines 710 to the upper surface of low-k fill layer 910 but without FAV for the metal interconnect lines 710.

FIG. 14-18 illustrate fabrication steps associated with advancing the overall device fabrication after formation of the underlying structure including MRAM cells and associated interconnect wires according to an embodiment of the invention.

Figure 14:
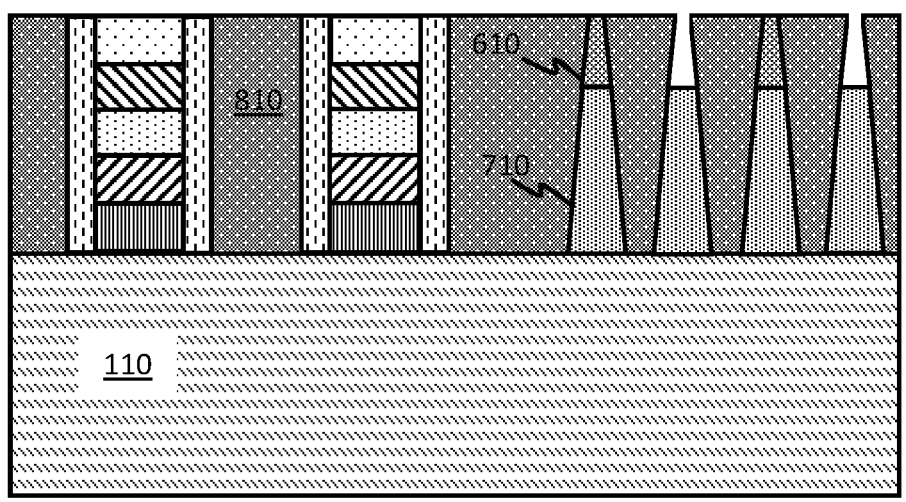
FIG. 14 provides a cross-sectional view of a step in the fabrication of a semiconductor device, according to an embodiment of the invention. The figure illustrates the device after selective removal of third hard mask portions exposing underlying interconnect metal.

FIG. 14 illustrates the device after the selective removal of third hard mask material 610 from selected metal interconnect lines 710. As shown in the figure, self-aligned vias are created for selected metal interconnect lines 710 by the removal of hard mask material 610 above those lines by a plasma dry etch of phased isotropic etching process, exposing underlying metal interconnect lines 710.

Figure 15:
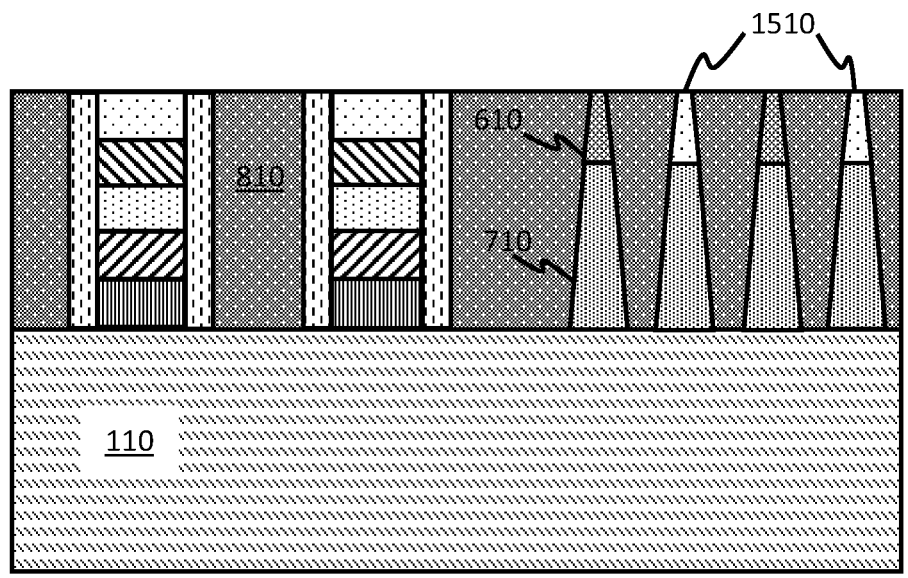
FIG. 15 provides a cross-sectional view of a step in the fabrication of a semiconductor device, according to an embodiment of the invention. The figure illustrates the device after the metallization of the selected interconnect vias by metal growth.

FIG. 15 illustrates intermediate device 100 after formation of metal contacts for the selected metal interconnect lines 710. As shown in the figure, metal contacts 1510 fill the FAV for the selected metal interconnect lines 710.

Figure 16:
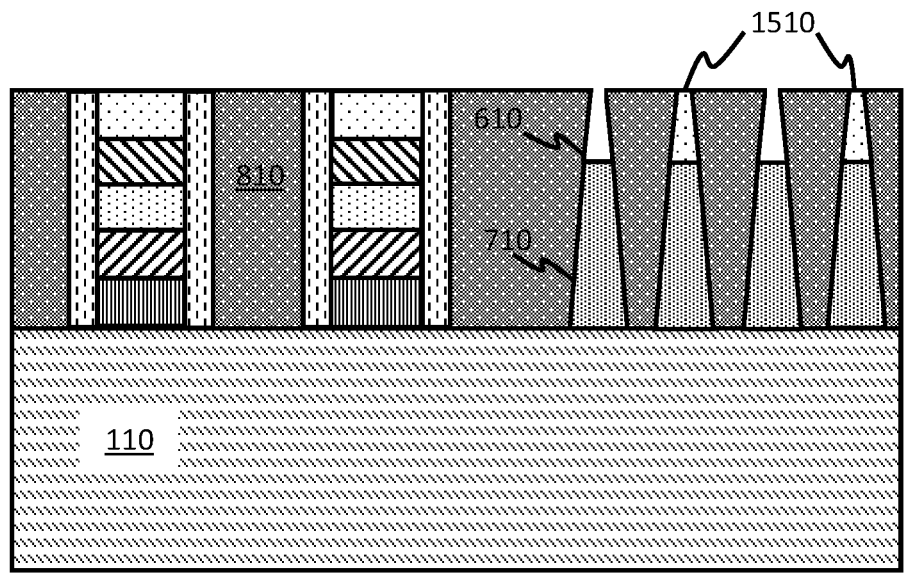
FIG. 16 provides a cross-sectional view of a step in the fabrication of a semiconductor device, according to an embodiment of the invention. The figure illustrates the device after removal of the remaining third hard mask exposing interconnect metal.

FIG. 16 illustrates intermediate device 100 after the subsequent removal of third hard mask material 610 from the remaining metal interconnect lines 710. As shown in the figure, third hard mask material 610 has been removed from above remaining metal interconnect lines 710.

Figure 17:
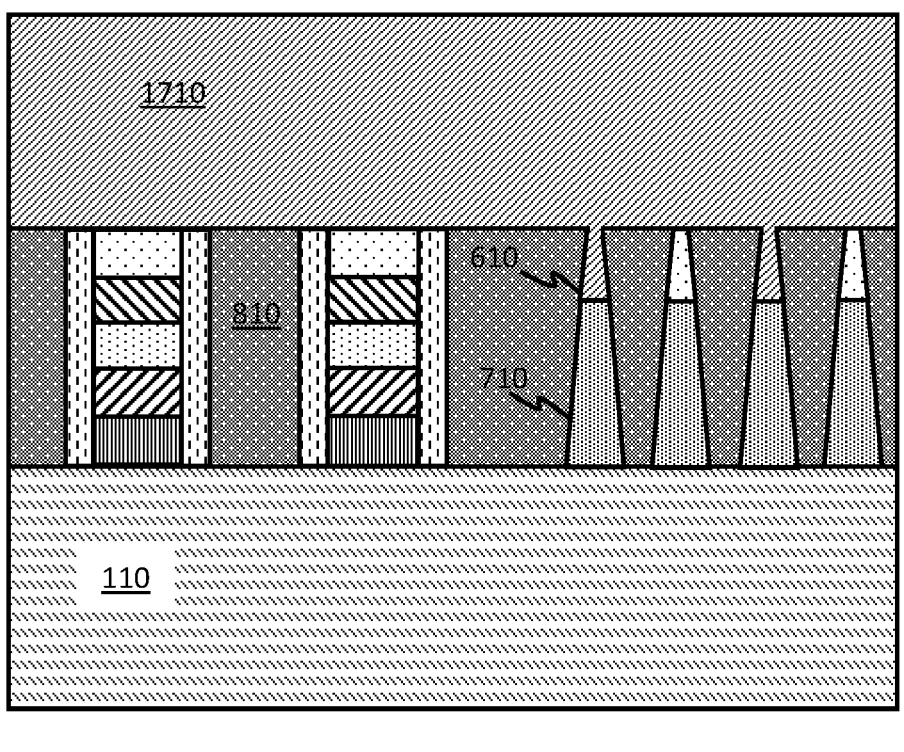
FIG. 17 provides a cross-sectional view of a step in the fabrication of a semiconductor device, according to an embodiment of the invention. The figure illustrates the device after deposition of a protective low-k layer.

FIG. 17 illustrates intermediate device 100 after the deposition of low-k fill layer 1710. Flowable CVD low-k dielectric material may be used to form the low-k fill layer as described before. The low-k material fills the vias etched through the ILD material 810 to the unused metal interconnects 710.

Figure 18:
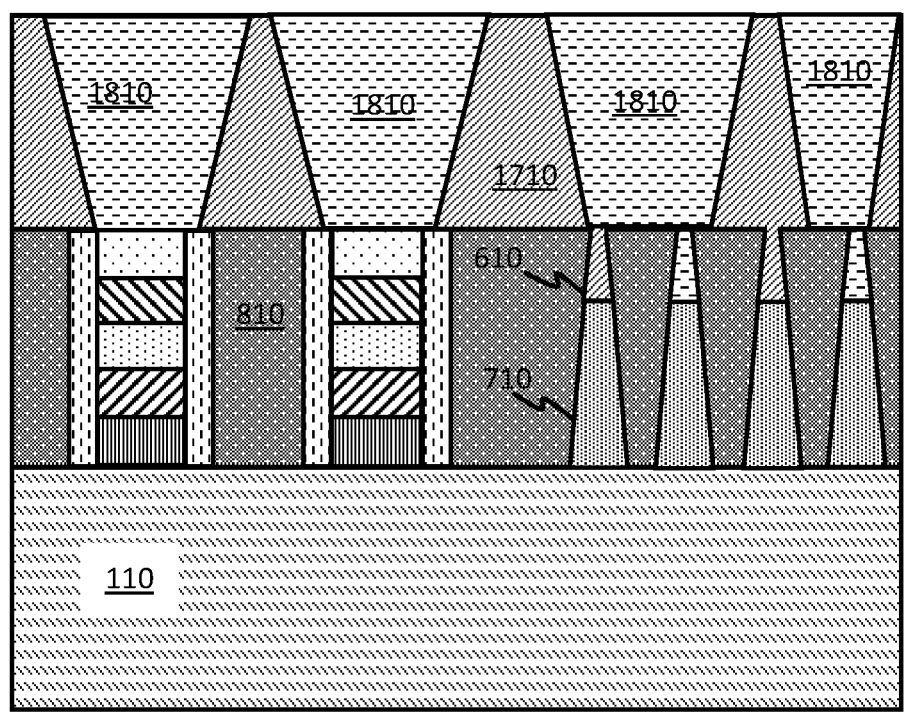
FIG. 18 provides a cross-sectional view of a step in the fabrication of a semiconductor device, according to an embodiment of the invention. The figure illustrates the device after formation and subsequent filling of interconnect and MRAM electrode vias.

FIG. 18 illustrates intermediate device 100 after completion of metal contacts for MRAM cell structures 210 and metal interconnect lines 710 through low-k fill layer 1710. As illustrated in the figure, vias are etched through low-k fill layer 1710, and metallization fills the vias producing metal contacts 1810 for the underlying MRAM cell structures 210 and the metal interconnect lines 710 at the upper surface of the low-k fill layer 1710. In this embodiment, device capacitance issues are reduced due to the replacement of third hard mask material 410 with a low-k dielectric material 1710 between unused metal interconnect lines 710 and metal contacts 1810.

Figure 19:
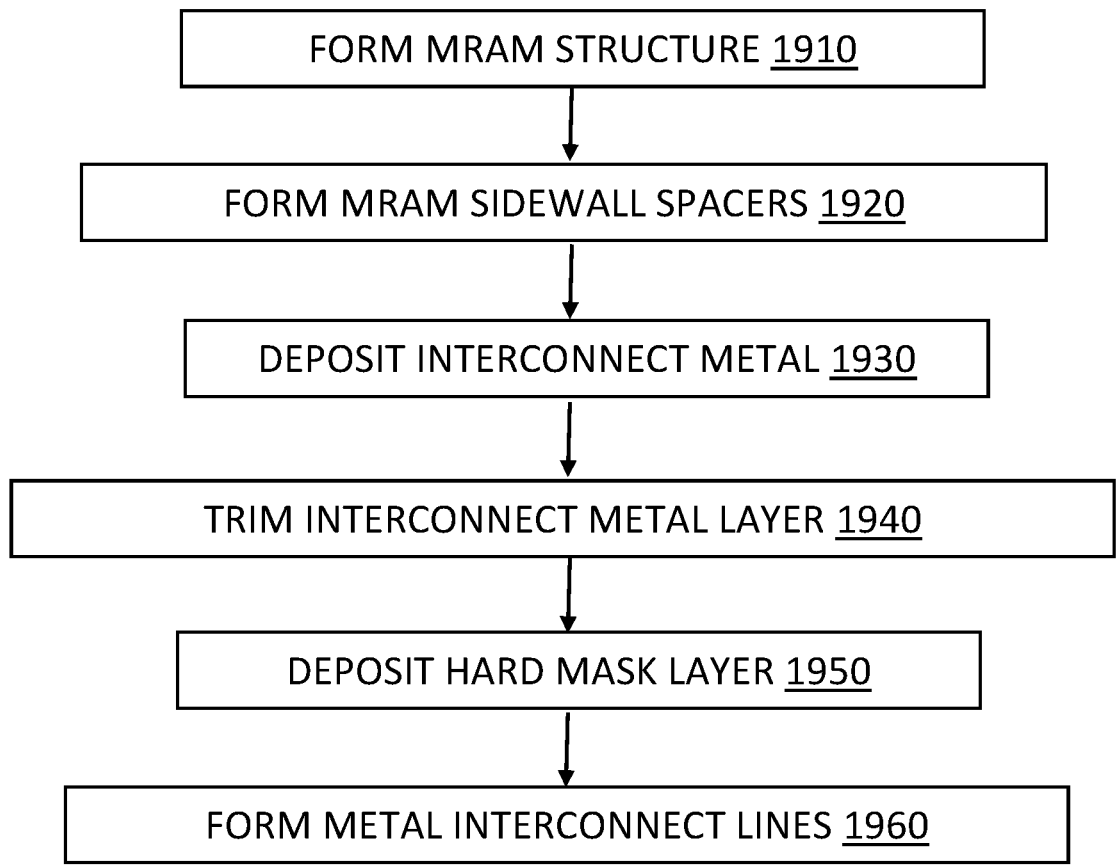
FIG. 19 provides a flowchart depicting operational steps for forming semiconductor device, according to an embodiment of the invention.

FIG. 19 provides flowchart 1900 setting forth illustrative steps in the fabrication of semiconductor devices according to embodiments of the invention. As shown in the figure, at block 1910, an MRAM structure is formed. The MRAM structure includes a reference layer, a tunnel barrier, a free layer an upper electrode, a first protective hard mask layer, an SiO₂ layer, and a second hard mask layer. The first and second hard mask layers may constitute the same hard mask material. The respective layers are deposited in sequence upon the underlying semiconductor device and selectively etched away yielding a plurality of MRAM cell structures. Each MRAM cell structure capped by the first and second hard mask layers separated by the SiO₂ layer.

At block 1920, sidewall spacers are formed adjacent to the vertical surfaces of the MRAM cell structures. The sidewall spacers may be formed using SIT or by depositing and selectively etching, such as RIE, to form the sidewalls.

At block 1930, deposition of a layer of interconnect metal occurs around and above the MRAM cell structures and associated sidewall spacers. In an embodiment, deposition occurs using PVD due to the relatively high thickness of interconnect metal required.

At block 1940, the layer of interconnect metal is planarized to the upper surface of the MRAM cell structure, the layer of interconnect metal is then further trimmed, recessing the layer to the desired height of the metal interconnect lines of the device design.

At block 1950, deposition of a second hard mask material, in one embodiment a hard mask material dissimilar to the hard mask material of the MRAM cell structures, occurs above the trimmed and recessed metal interconnect layer.

At block 1960, the second hard mask material and the metal interconnect layer are patterned and etched yielding an intermediate device having MRAM cell structures with a protective hard mask cap and metal interconnect lines having protective hard mask caps of a different hard mask material. The etching process yields metal interconnect lines having a reverse tapered cross-section such that the base of each metal interconnect line adjacent to the underlying semiconductor device is larger than the top surface of the metal interconnect line adjacent to the second hard mask material.

Figure 20:
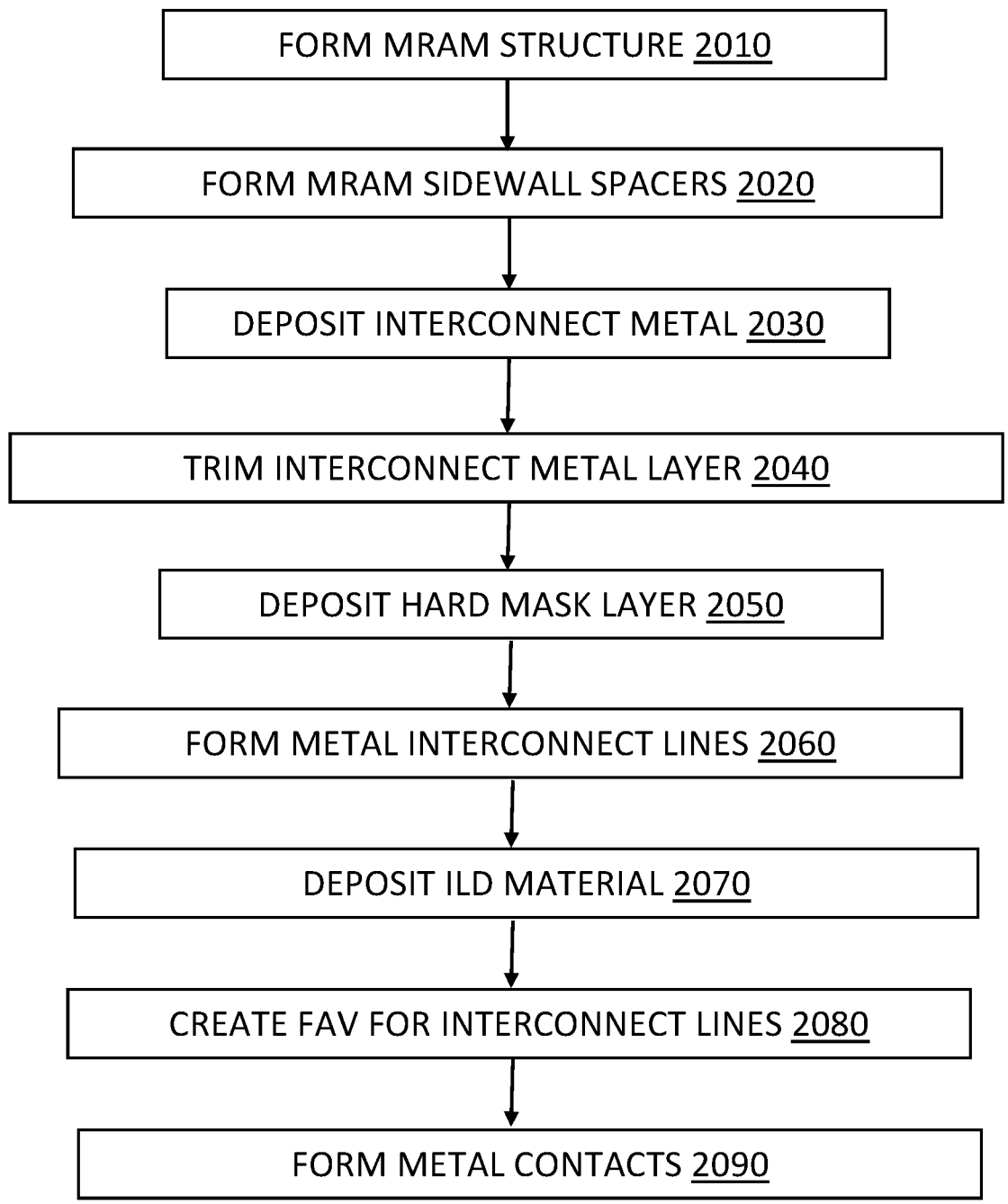
FIG. 20 provides a flowchart depicting operational steps for forming semiconductor device, according to an embodiment of the invention.

FIG. 20 provides flowchart 2000 setting forth illustrative steps in the fabrication of semiconductor devices according to embodiments of the invention. As shown in the figure, at block 2010, an MRAM structure is formed. The MRAM structure includes a reference layer, a tunnel barrier, a free layer an upper electrode, a first protective hard mask layer, an SiO₂ layer, and a second hard mask layer. The first and second hard mask layers may constitute the same hard mask material or differing hard mask materials. The respective layers are deposited in sequence upon the underlying semiconductor device and selectively etched away yielding a plurality of MRAM cell structures. Each MRAM cell structure is capped by the first and second hard mask layers separated by the SiO₂ layer.

At block 2020, sidewall spacers are formed adjacent to the vertical surfaces of the MRAM cell structures. The sidewall spacers may be formed using SIT or by depositing and selectively etching, such as RIE, to form the sidewalls.

At block 2030, deposition of a layer of interconnect metal occurs around and above the MRAM cell structures and associated sidewall spacers. In an embodiment, deposition occurs using PVD due to the relatively high thickness of interconnect metal required.

At block 2040, the layer of interconnect metal is planarized to the upper surface of the MRAM cell structure, the layer of interconnect metal is then further trimmed, recessing the layer to the desired height of the metal interconnect lines of the device design.

At block 2050, deposition of a third hard mask material, in one embodiment a hard mask material dissimilar to the hard mask material of the MRAM cell structures, occurs above the trimmed and recessed metal interconnect layer. In an embodiment, the top surface of the MRAM and third hard mask layers are disposed at about the same height above the base substrate of the device. As used herein, about the same means that the two heights are substantially the same. In an embodiment, the two heights are co-planar at a single height above the substrate of the device.

At block 2060, the third hard mask material and the metal interconnect layer are patterned and etched yielding an intermediate device having MRAM cell structures with a protective hard mask cap and metal interconnect lines having protective hard mask caps of a different hard mask material. The etching process yield metal interconnect lines having a reverse tapered cross-section such that the base of each metal interconnect line adjacent to the underlying semiconductor device is longer than the top surface of the metal interconnect line adjacent to the second hard mask material.

At block 2070, deposition of ILD material occurs in spaces adjacent to the MRAM sidewall spacers and between the metal interconnect lines. CMP processes trim back and smooth the ILD material to the height of the MRAM hard mask and the metal interconnect line hard mask.

At block 2080, FAV for metal interconnect lines are created by etching away selected metal interconnect hard mask material portions using RIE or other etching methods.

At block 2090, metallization processes fill the FAV, creating metal contacts for the metal interconnect lines.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device including magnetoresistive random-access memory (MRAM) comprising:
   an MRAM cell capped with a first hard mask, the first hard mask having a first height;
   at least one metal line capped with a second hard mask, the second hard mask having a second height; wherein the first height and the second height are about the same height; and
   a low-k dielectric layer disposed above the MRAM cell and the metal wire.

2. The semiconductor device according to claim 1, wherein the at least one metal line has a cross-sectional profile having a negative taper such that the base of the at least one metal line adjacent to the MRAM cell is larger than the top surface of the at least one metal line adjacent to the second hard mask material.

3. The semiconductor device according to claim 1, further comprising sidewall spacers disposed adjacent to the MRAM cell.

4. The semiconductor device according to claim 1, wherein the at least one metal line comprises ruthenium.

5. The semiconductor device according to claim 1, wherein the second hard mask comprises SiN.

* * * * *